United States Patent [19]

Hashimoto et al.

[11] 4,309,589
[45] Jan. 5, 1982

[54] METHOD AND APPARATUS FOR ELECTRON BEAM WELDING

[75] Inventors: Tatsuya Hashimoto, Tokyo; Michio Inagaki, Machida; Hirosada Irie, Yokohama; Susumu Tukamoto, Kawasaki, all of Japan

[73] Assignee: National Research Institute for Metals, Tokyo, Japan

[21] Appl. No.: 22,498

[22] Filed: Mar. 21, 1979

[30] Foreign Application Priority Data

Jul. 25, 1978 [JP] Japan .................................. 53/89982
Jul. 25, 1978 [JP] Japan .................................. 53/89983
Jan. 29, 1979 [JP] Japan .................................. 54/8196
Jan. 29, 1979 [JP] Japan .................................. 54/8197

[51] Int. Cl.³ ............................................ B23K 15/00
[52] U.S. Cl. ...................... 219/121 ED; 219/121 EC; 219/121 EA; 250/397
[58] Field of Search ................. 219/121 EB, 121 EM, 219/121 EA, 121 EC, 121 ED, 121 ES; 250/396 R, 397

[56] References Cited

U.S. PATENT DOCUMENTS 3,158,733 11/1964 Sibley ........................... 219/121 EB
3,371,185 2/1968 Anderson ..................... 219/121 EB
4,127,762 11/1978 Paton et al. .................. 219/121 EM

FOREIGN PATENT DOCUMENTS 2013950 9/1971 Fed. Rep. of Germany ...... 219/121 EB
139103 12/1979 German Democratic Rep. ............................ 219/121 EC
1285560 8/1972 United Kingdom ......... 219/121 EB
173587 8/1965 U.S.S.R. ...................... 219/121 EB

OTHER PUBLICATIONS

Welding Journal; 2/76, Welding Research Supplement, pp. 525-545, "Electron Beam Welding Spike Suppression Using Feedback Control", by Tews et al.

Primary Examiner—Gene Z. Rubinson
Assistant Examiner—Keith E. George
Attorney, Agent, or Firm—Sherman & Shalloway

[57] ABSTRACT

A method and an apparatus for electron beam welding, in which the oscillation of the focus of an electron beam which is due to the pulsation of a direct-current high voltage for accelerating electrons is detected, and the electron beam is controlled according to the detected oscillation of the focus of the electron beam.

37 Claims, 21 Drawing Figures

METHOD AND APPARATUS FOR ELECTRON BEAM WELDING

BACKGROUND OF THE INVENTION

1. Field of the Invention

This invention relates to a method and an apparatus for electron beam welding. More specifically, it relates to a method for electron beam welding which comprises accelerating electrons by the application of a high voltage to produce an electron beam, converging the electron beam by means of a converging lens generally known as a magnetic lens, irradiating the converged electron beam onto materials to be welded thereby to impinge the electrons against the materials, and melting the materials by the heat of impact; and to an apparatus for effecting this method.

2. Description of the Prior Art

Electron beam welding is a technique for joining materials by utilizing a high kinetic energy of electron beam, and has the advantage of being able to afford a weld bead having a large penetration depth and a very narrow melting width. As is well known to those skilled in the art, however, electron beam welding has special problems. When electron beam welding is to be performed by melting the joining materials partly in their thickness direction (to be referred to as the "partial penetration welding procedure"), spikes, cold shuts and pores tend to form on the penetrating end portion of the molten area of the joining materials. In the case of melting the joining materials along their entire thickness (to be referred to as the "full penetration welding procedure"), the weld bead tends to become uneven on the back surface of the joining materials.

In an attempt to solve the aforesaid problems associated with electron beam welding by the partial penetration welding procedure, it has been suggested to reduce the power density of electron beam by increasing the diameter of the converged electron beam, or by continuously oscillating the electron beam sideways. Techniques based on these suggestions are in practical use. However, these techniques naturally lead to a decrease in weld penetration depth and an increase in bead width, and offset the aforesaid advantage of electron beam welding. In the case of welding by the full penetration welding procedure, on the other hand, it has been suggested to solve the aforesaid problem by increasing the electric current value of electron beam to more than that required for full penetration welding to cause the central portion of the electron beam which has a high power density to pass completely through the joining materials so as not to use the central portion of the electron beam for the melting of the joining materials, and melting the joining materials by the surface portion of the electron beam which has a low power density. Such a technique is already in use, but has the disadvantage that power consumption is exceedingly high.

SUMMARY OF THE INVENTION

It is a primary object of this invention to provide a new and useful method and apparatus for electron beam welding, which provides a solution to the aforesaid problems without impairing the aforesaid advantage of electron beam welding and without posing a new problem.

Another object of this invention is to provide a new and useful method and apparatus for electron beam welding which in the partial penetration welding procedure, can prevent or inhibit the formation of spikes, cold shuts and pores at the penetrating end portion of the molten area of the joining materials without decreasing the weld penetration depth or increasing the bead width.

Still another object of this invention is to provide a new and useful method and apparatus for electron beam welding which in the full penetration welding procedure, can form a weld bead of relatively good uniformity even at the back surfaces of joining materials without consuming excessively high electric power or without greatly increasing the thickness of the welded part.

In electron beam welding, electrons are accelerated by a direct-current high voltage. A direct-current high voltage supplied from an ordinary power source is not of a pure direct current, but pulsates or ripples. The pulsation of the direct-current high voltage causes the focus of the electron beam to oscillate in the direction of the electron beam. The present inventors carefully investigated the oscillation of the focus of an electron beam and the molten state of material to be welded in an electron beam welding process from a microscopical viewpoint. The investigation has led to the discovery that the aforesaid special problems with electron beam welding are due mainly to the oscillation of the focus of the electron beam in the aforesaid manner and to the consequent variation in the molten state of the materials to be welded. Accordingly, the use of a substantially pulsation-free direct-current voltage for electron acceleration would be a solution to the various special problems associated with electron beam welding. It is not economical, if not impossible, however, to make such direct-current high voltage substantially free from pulsation because an expensive special device is required for preventing the surge voltage which is due to an arcing phenomenon during welding.

The present inventors furthered their investigations about the oscillation of the focus of the electron beam and the molten state of materials to be welded in electron beam welding, and consequently found that the aforesaid special problems with electron beam welding can be avoided or inhibited by properly controlling the electron beam according to the oscillation of its focus.

According to this invention, there is provided an improved method for electron beam welding which comprises producing electrons, accelerating the electrons by the application of a high voltage to form an electron beam, converging the electron beam with a converging lens, and irradiating the converged electron beam onto materials to be welded, wherein the oscillation of the focus of said electron beam which is due to the ripple of said high voltage is detected, and the electron beam is controlled according to the detected oscillation of said focus.

The invention also provides an improved electron beam welding apparatus comprising an electron gun having a filament, a heating power source for supplying an electric current to the filament to heat it and emit electrons from the filament and a high voltage power source for accelerating the electrons by the application of a high voltage to form an electron beam; and a converging lens for converging the electron beam from the electron gun and irradiating it onto materials to be welded; wherein said apparatus further comprises a detecting means for detecting the oscillation of the focus of the electron beam which is due to the pulsation of said high voltage, and a control means for controlling the electron beam according to the detected oscillation of said focus.

The oscillation of the focus of the electron beam can be detected conveniently by capturing electrons emitted from the superheated molten portion of the materials to be welded, or by detecting the ripple of the high voltage.

The electron beam can be suitably controlled by decreasing and/or increasing the electric current value of the electron beam by a suitable amount for a predetermined period of time according to the oscillation of the focus of the electron beam, or by oscillating the electron beam sideways at a high frequency for a predetermined period of time according to the oscillation of the focus of the electron beam.

BRIEF DESCRIPTION OF THE DRAWINGS

FIGS. 4-A to 4-F are waveform diagrams showing the output signals of various electrical control units employed in the first embodiment illustrated in FIG. 1;

FIGS. 7-A to 7-C are waveform diagrams showing the output signals of various electrical control units employed in the third embodiment illustrated in FIG. 6;

FIGS. 9-A, 10-A and 11-A are side elevations showing the profiles of weld beads obtained in Example 3 and Comparative Examples 4 to 7 by the full penetration welding procedure; and FIGS. 9-B, 10-B and 11-B are cross-sectional views of the weld beads shown in FIGS. 9-A, 10-A and 11-A, respectively.

DETAILED DESCRIPTION OF THE INVENTION

Some preferred embodiments of this invention are described in detail below with reference to the accompanying drawings. Throughout the drawings, the same parts are indicated by the same reference numerals.

Figure 1:
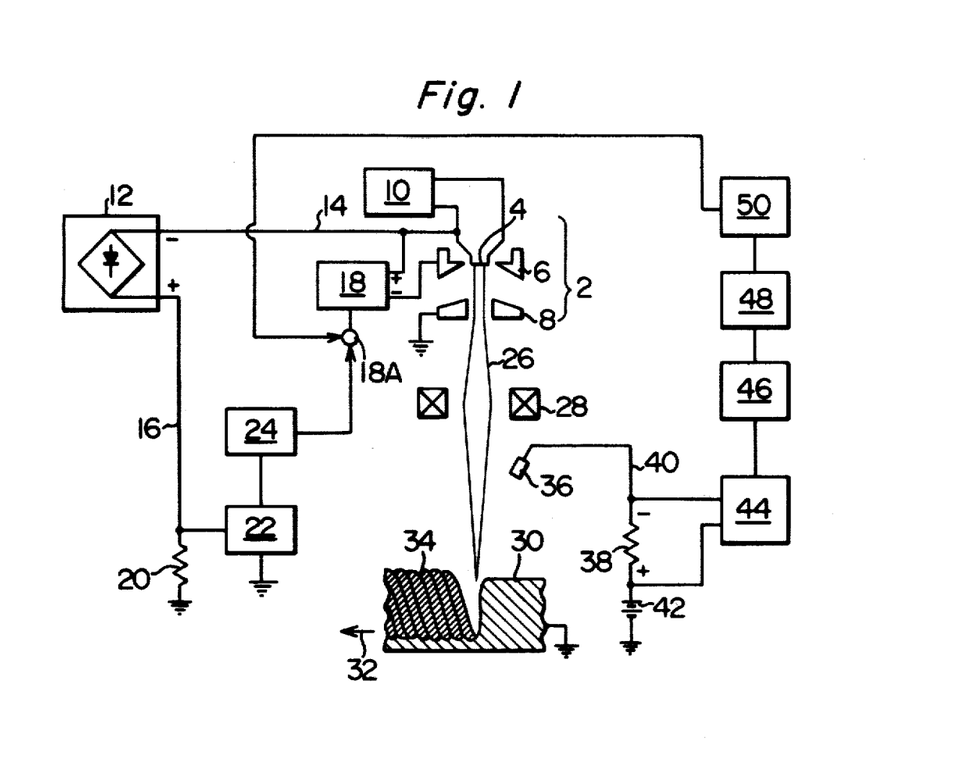
FIG. 1 is a simplified view showing a first embodiment of the electron beam welding apparatus of this invention.

Referring to FIG. 1 which shows the first embodiment of the electron beam welding apparatus of this invention, the apparatus includes an electron gun 2 which is equipped with a filament 4, a Wehnelt electrode 6 disposed in proximity to, and around, the filament 4, and a grounded anode 8. A heating power source 10 is connected to the filament 4 for supplying an electric current thereto and heating it. Furthermore, the negative side of a direct-current high voltage power source 12 is connected to the filament 4 through a line 14. The positive side of the direct-current high voltage power source 12 is grounded through a line 16. A bias voltage amplifier 18 is connected both to the line 14 and to the Wehnelt electrode. The line 16 through which the positive side of the direct-current high voltage power source 12 is grounded includes a resistance 20, and the input of a low-pass filter 22 is connected to the line 16. The output of the low-pass filter 22 is connected to the input of a bias voltage control circuit 24, and the output of the bias voltage control circuit 24 is connected to an input terminal 18A of the bias voltage amplifier 18.

In the electron gun 2, the filament 4 is heated by the electric current supplied thereto from the heating power source 10, thereby emitting large quantities of thermal electrons. The emitted electrons are accelerated by the action of a direct-current high voltage (e.g., 30 to 150 KV) applied across the filament 4 and the grounded anode 8 from the direct-current high voltage power source 12, thus forming an electron beam 26. The current of the electron beam 26 can be adjusted to the desired value by adjusting the bias voltage applied to the Wehnelt electrode 6. In the electron gun 2 illustrated in the drawing, the electric current value of the electron beam 26 is determined by detecting the voltage drop across the resistance 20 by means of the low-pass filter 22. As will be described hereinbelow, the direct-current high voltage supplied by the power source 12 is of not a complete direct current which provides a fixed voltage value, but is a pulsating voltage containing a ripple. Therefore, the induced voltage at the resistance 20 is also a pulsating voltage. The low-pass filter 22 detects the root-mean-square value of the pulsating voltage. The detected current value of the electron beam 26 is compared with the current fed into the bias voltage control circuit 24, i.e. the required current of the electron beam 26, in the bias voltage control circuit 24, and a voltage signal corresponding to the difference between the detected current value and the required current value of the electron beam 26 is supplied to the bias voltage amplifier 18. Thus, the current value of the electron beam 26 is adjusted to the required current value fed into the bias voltage control circuit 24 by controlling the voltage to be applied to the Wehnelt electrode 6.

A converging lens 28 is disposed under the electron gun 2. The converging lens 28 converges the electron beam 26 from the electron gun 2 and irradiates it onto materials 30 to be welded. As a result, the irradiated portion of the materials 30 is heated and melted by the kinetic energy of the electrons. Thus, by moving the materials 30 at a suitable speed in the direction shown by the arrow 32 by a suitable means (not shown), the heated and melted portions successively depart from the electron beam 26 and solidify, thereby to form a weld bead 34.

The structure and operation of the electron beam welding apparatus illustrated in FIG. 1 are known to those skilled in the art, and no more detailed description would be necessary on these items.

Figure 2:
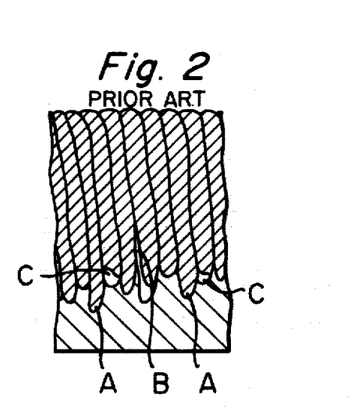
FIG. 2 is a cross-sectional view showing the defects of a weld bead which occur when a conventional electron beam welding process is performed by the partial penetration welding procedure.

In the electron beam welding apparatus described hereinabove, the focus of the electron beam 26 oscillates in the direction of the electron beam 26 (in the vertical direction in FIG. 1) because the direct-current high voltage supplied from the power source 12 is not a complete direct-current high voltage having a uniform voltage value but is a pulsating voltage. Owing to the oscillation of the focus of the electron beam 26, defects occur in the resulting weld bead in the conventional electron beam welding process. Specifically, as shown in FIG. 2, when the welding is performed by melting the joining materials partly in their thickness direction, spikes A (portions molten and solidified and extending deeper than the remainder), cold shuts B (portions where union is poor), and pores C occur in the resulting weld bead as shown in FIG. 2. When the welding is performed by melting the thick joining materials along their entire thickness, the resulting weld bead becomes serrate as shown by D in FIG. 3 on the back surfaces of the joining materials.

According to the present invention, the aforesaid defects associated with the conventional electron beam process are prevented or inhibited by detecting the oscillation of the focus of the electron beam 26 and controlling the electron beam 26 according to the detected oscillation of its focus. To achieve it, the following improvements have been made in the electron beam welding apparatus shown in FIG. 1.

Figure 4:
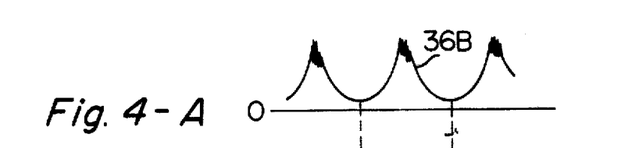

In the electron beam welding apparatus shown in FIG. 1, a detecting electrode 36 is provided above the joining materials 30, and a positive direct-current voltage is applied thereto by a direct-current power source 42 whose positive side is connected to the detecting electrode 36 through a line 40 including a resistance 38. As is known, thermal electrons are emitted from the superheated molten portion of the weld materials 30. These electrons are caught by the detecting electrode 36. Thus, when the focus of the electron beam 26 moves upward and performs mainly the superheating of the surface area of the joining materials 24, large quantities of electrons arrive at the detecting electrode 36. When the focus of the electron beam 26 moves downward and approaches the penetrating end portion of the molten area, and performs mainly the superheating of the penetrating end portion of the molten area of the joining materials 30, only relatively small amounts of electrons arrive at the detecting electrode 36. Hence, the amount of electrons caught by the detecting electrode 36 corresponds to the oscillation of the focus of the electron beam 26 which occurs owing to the pulsation of the direct-current high voltage supplied from the power source 12. When the detecting electrode 36 captures electrons, an electric current flows through the line 40 according to the amount of the electrons caught. Hence, the variation in the amount of the electrons caught by the detecting electrode 36 results in the variation of the current flowing through the line 40. Such a variation in current corresponds to the pulsation of the direct-current high voltage supplied from the direct-current high voltage power source 12, and is indicated by numeral 36B in FIG. 4-A.

In the electron beam welding apparatus illustrated in FIG. 1, the variation in the current flowing the line 40 is detected by a detecting circuit 44 as the variation in the induced voltage at the resistance 38. The detecting circuit 44 produces an output signal 44B as shown in FIG. 4-B which increases with increasing value of the current flowing through the line 40 and decreases with decreasing value of the current flowing through the line 40. The output signal 44B of the detecting circuit 44 is fed into a trigger signal generator 46 which produces a trigger signal 46B shown in FIG. 4-C when the signal 44B changes from positive to negative. The output signal 46B from the trigger signal generator 46 is fed into a delay circuit 48 which delays the signal 46B by a predetermined amount of time and produces a trigger signal 48B as shown in FIG. 4-D. The output signal 48B from the delay circuit 48 is fed into a function generator 50 which generates a pulse wave 50B as shown in FIG. 4-E when the current flowing through the line 40 decreases and therefore, the focus of the electron beam 26 moves downwardly and approaches the penetrating end portion of the molten area. The pulse wave 50B is supplied to an imput 18A of the bias voltage amplifier 18 into which the output signal of the bias voltage control circuit 24 is to be fed. Consequently, the bias voltage applied to the Wehnelt electrode 6 through the bias voltage amplifier 18 is changed to the one shown by numeral 18B in FIG. 4-F by the action of the pulse wave 50B. In other words, when the focus of the electron beam 26 moves downwardly and approaches the penetrating end portion of the molten area, the absolute value of the bias voltage increases, and therefore, the current value of the electron beam 26 decreases.

Figure 3:
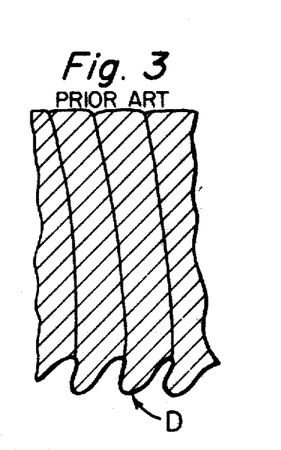
FIG. 3 is a cross-sectional view showing one profile of a weld bead which is formed by performing the conventional electron beam welding process in accordance with the full penetration welding procedure.

The defects of the weld metal described hereinabove with reference to FIGS. 2 and 3 can be avoided or markedly inhibited by decreasing the current value of the electron beam 26 when the focus of the electron beam 26 moves downwardly and approaches the penetrating end portion of the molten area.

It is important that the time interval for reducing the current value of the electron beam 26 should be not more than $\frac{1}{2}$ of the oscillating period of the focus of the electron beam 26. In other words, it is important that the duration of the pulse wave 50B should be not more than $\frac{1}{2}$ of the period of the signal 44B.

It is also important that the degree of the decrease of the current of the electron beam 26 should be not more than 15%, especially not more than 10%, of the current value of the electron beam 26. If the current value of the electron beam 26 is reduced to an extent of more than 15%, the mode of variation of the current flowing through the line 40, and therefore the output signal 44B from the detecting circuit, considerably change, and the intended control of the current value of the electron beam 26 may become impossible.

In the embodiment shown in FIG. 1, the current value of the electron beam 26 is decreased when the focus of the electron beam 26 moves downwardly and approaches the penetrating end portion of the molten area. Alternatively, a similar effect can be obtained by increasing the current value of the electron beam 26 when the focus of the electron beam 26 moves upward and is away from the penetrating end portion of the molten area. This increases the amount of molten metal at the penetrating end portion, and prevents such a sharp melting at the penetrating end portion of the molten area as to form spikes which may be caused by the subsequent downward movement of the focus of the electron beam 26. If desired, it is possible to decrease the current value of the electron beam 26 when its focus moves downwardly and approaches the penetrating end portion of the molten area, and to increase the current value of the electron beam 26 when its focus moves upwardly and is away from the penetrating end portion of the molten area.

Figure 5:
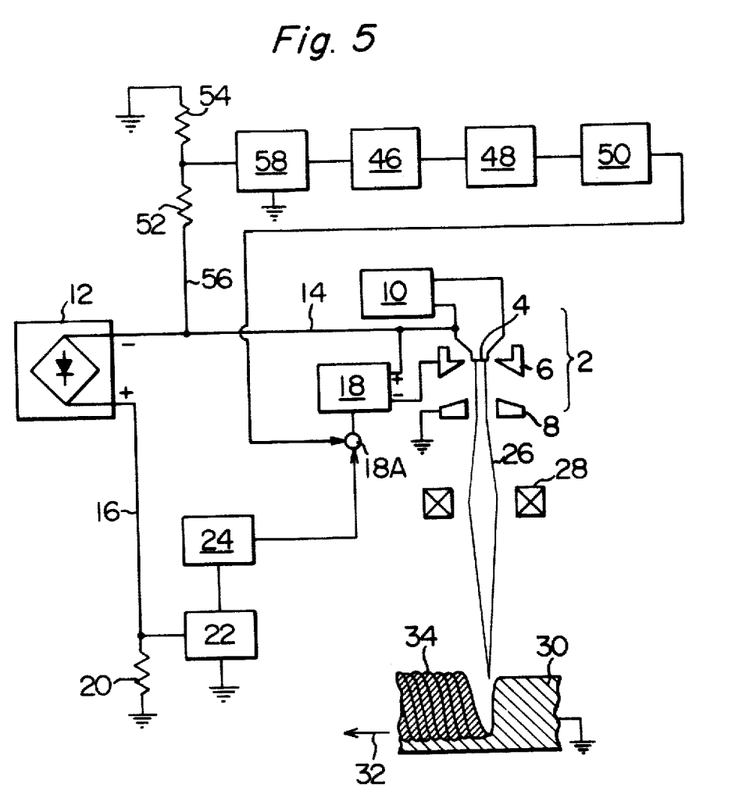
FIG. 5 is a simplified view showing a second embodiment of the electron beam welding apparatus of this invention.

FIG. 5 shows the second embodiment of the electron beam welding apparatus of this invention. As described above with reference to the first embodiment shown in FIG. 1, the oscillation of the focus of electron beam 26 is detected by capturing electrons released from the molten part of weld materials by means of detecting electrode 36. In the second embodiment shown in FIG. 5, the oscillation of the focus of the electron beam 26 is detected by detecting the pulsation of the direct-current high voltage supplied by direct-current high voltage power source 12.

In the second embodiment shown in FIG. 5, line 14 through which the negative side of direct-current high voltage source 12 is connected to filament 4 is grounded through a line 56 including a high resistance 52 and a low resistance 54 connected in series to each other. To this line 56 is connected a detecting circuit 58 for detecting the pulsation of the induced voltage at the low resistance 54. The detecting circuit 58 detects the variation of the current flowing through the line 56, i.e., the variation of the direct-current high voltage supplied by power source 12, as the variation of the induced voltage at the low resistance 54, and thus produces a signal corresponding to the ripple of the direct-current high voltage supplied by power source 12. This signal produced by the detecting circuit 58 is substantially the same as the signal produced by the detecting circuit 44 in the first embodiment shown in FIG. 1, i.e. the signal 44B shown in FIG. 4-B. This signal produced by the detecting circuit 58 is supplied to input 18A of bias voltage amplifier 18 through trigger signal generator 46, delay circuit 48 and function generator 50 as is the case with the signal 44B in the first embodiment. It will be obvious therefore that in the second embodiment, too, the current value of the electron beam 26 can be controlled according to the oscillation of the focus of the electron beam 26 as is the case with the first embodiment described above.

Figure 6:
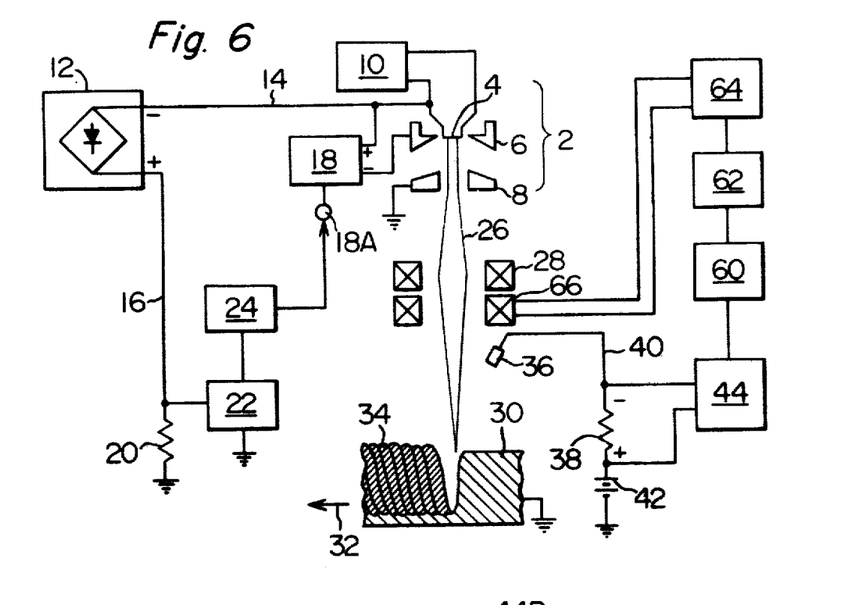
FIG. 6 is a simplified view showing a third embodiment of the electron beam welding apparatus of this invention.

FIG. 6 shows the third embodiment of the electron beam welding apparatus of this invention. In the first embodiment shown in FIG. 1, the current value of the electron beam 26 is changed by changing the bias voltage applied to the Wehnelt electrode according to the oscillation of the focus of the electron beam 26. In the third embodiment shown in FIG. 6, the power density of the electron beam 26 is substantially reduced by oscillating the electron beam 26 sideways at a high frequency according to the oscillation of the focus of the electron beam 26 (more specifically, when the focus of the electron beam 26 moves downward and is superheating mainly the penetrating end portion of the molten area of the weld materials 30).

In the third embodiment shown in FIG. 6, a detecting electrode 36 is provided above the materials 30 to be welded. The positive side of direct-current power source 42 is connected to the detecting electrode 36 through a line 40 containing a resistance 38, and a positive direct-current voltage is applied to the detecting electrode 36. The variation of the current flowing through line 40, i.e. the oscillation of the focus of the electron beam 26, is detected by the detecting circuit 44. In the third embodiment shown in FIG. 6, however, the output signal from the detecting circuit 44 is supplied to a deflecting coil provided adjacent, and beneath, the converging lens 28 through a comparator 60, an oscillator 62 and a power amplifier 64.

Figure 7:
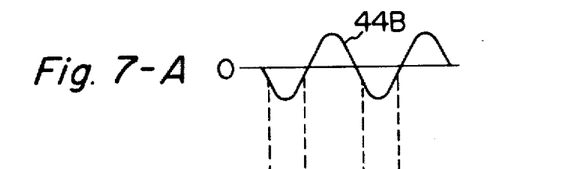

The comparator 60 which receives the output signal 44B of detecting circuit 44 having the waveform shown in FIG. 7-A (this waveform is quite the same as that shown in FIG. 4-B) produces an output signal 60B as shown in FIG. 7-B when the signal 44B is negative and its absolute value exceeds a predetermined value. The oscillator 62 which receives the output signal 60B from the comparator 60 is excited by the output signal 60B and produces an output signal 62B of high frequency as shown in FIG. 7-C. The signal 62B is amplified by the power amplifier 64, and applied to the deflecting coil 66.

Thus, in the third embodiment shown in FIG. 6, when the output signal 44B of the detecting circuit 44 is negative and has an absolute value exceeding a predetermined value (i.e., when the focus of the electron beam 26 moves downward), the electron beam 26 is oscillated at a high frequency in the lateral direction by the action of the deflecting coil 66, and consequently, the power density of the electron beam 26 is substantially reduced.

Thus, the defects described hereinabove with reference to FIGS. 2 and 3 can be avoided or markedly inhibited also by oscillating the electron beam 26 sideways upon the approaching of the focus of the electron beam 26 to the penetrating end portion of the molten area, and thereby reducing the power density of the electron beam 26.

The direction of oscillation of the electron beam 26 by the deflecting coil 66 may be any direction which is transverse to the axial line of the electron beam 26. Preferably, it is a direction at right angles to the moving direction (the direction shown by arrow 32) of the weld materials 30, or a direction inclined at a certain fixed angle to the moving direction of the weld materials 30.

It is important that the frequency of the signal 62B produced by the oscillator 62 (i.e., the oscillating frequency of the electron beam 26 by the deflecting coil 66) should be at least 500 Hz, especially at least 1000 Hz. If the oscillating frequency of the electron beam 26 by the deflecting coil 66 is less than 500 Hz, the molten portion of the weld materials 30 oscillates owing to the oscillation of the electron beam 26 caused by the deflecting coil 66. This increases the width of weld bead 34, or considerably changes the mode of variation of the current flowing through the line 40 (i.e., the output signal 44B of detecting circuit 44). Consequently, the intended control of the oscillation of the electron beam 26 may become impossible.

Figure 8:
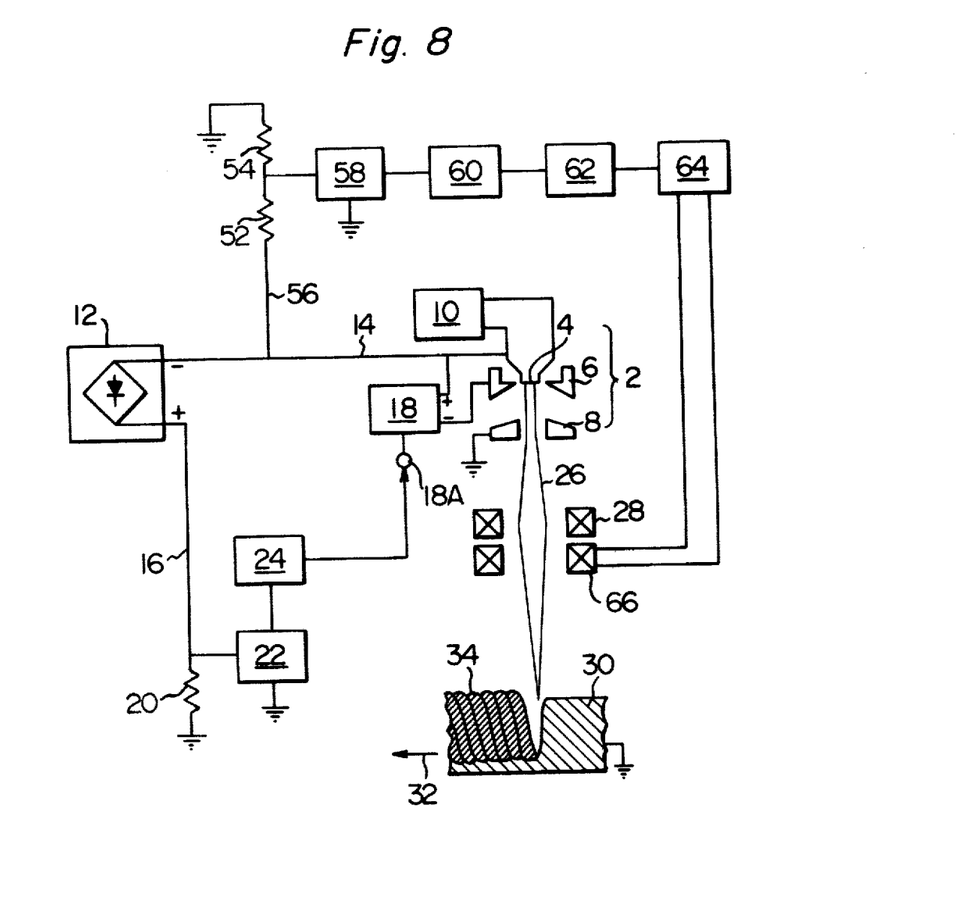
FIG. 8 is a simplified view showing a fourth embodiment of the electron beam welding apparatus of this invention.

FIG. 8 shows the fourth embodiment of the electron beam welding apparatus of this invention. In the fourth embodiment, the oscillation of the focus of the electron beam 26 is detected by detecting the pulsation of the direct-current high voltage supplied by the direct-current high voltage power supply 12, and when the focus of the electron beam 26 moves downward and is superheating mainly the penetrating end portion of the molten area of the weld materials 30, the electron beam 26 is oscillated sideways at a high frequency thereby to reduce substantially the power density of the electron beam 26.

In the fourth embodiment illustrated in FIG. 8 line 14 which connects the negative side of direct-current high voltage power source 12 to filament 4 is grounded through line 56 containing high resistance 52 and low resistance 54 connected in series to each other, as is the case with the second embodiment shown in FIG. 5. Detecting circuit 58 connected to line 14 through the line 56 detects the ripple of the direct-current high voltage supplied from the power source 12 as the variation of the induced voltage at the low resistance 54, and produces substantially the same signal as the signal 44B shown in FIG. 4-B or 7-A. Such a signal produced by the detecting circuit 58 is supplied to deflecting coil 66 through comparator 60, oscillator 62 and power amplifier 64 as is the case with the third embodiment shown in FIG. 6. Accordingly, in the fourth embodiment shown in FIG. 8, when the focus of the electron beam 26 moves downwardly and approaches the penetrating end portion of the molten area, the electron beam 26 is oscillated sideways at a high frequency to reduce the power density of the electron beam 26 in the same way as in the third embodiment shown in FIG. 6.

The following Examples and Comparative Examples illustrate the present invention.

EXAMPLE 1

Two steel sheets (SM50, JIS) were welded by the partial penetration welding procedure in an electron beam welding apparatus of the structure shown in FIG. 1. A direct-current high voltage of 40 KV was supplied from a direct-current high voltage power source 12, and the current value of electron beam 26 was set at 240 mA. The steel sheets were moved at a rate of 76.2 cm/min. during the welding process. The direct-current high voltage supplied from the power source 12 was a pulsating voltage having a ripple content of 3% in peak-to-peak with a main ripple frequency of 100 Hz.

When the current flowing through line 40 was maximum during the welding, a triangular wave pulse with a frequency of 250 Hz was produced by function generator 50 to increase the peak value of the current of electron beam 26 by 10% (i.e., 24 mA).

The resulting weld bead had the characteristics shown in Table 1.

COMPARATIVE EXAMPLE 1

Electron beam welding was performed by the partial penetration welding procedure under the same conditions as in Example 1 except that the current value of electron beam 26 was not increased according to the variation of the current flowing through line 40. The resulting weld bead had the characteristics shown in Table 1.

TABLE 1

| Run | Penetration depth (mm) | Maximum length of spike (mm) | Number of pores per cm |
|---|---|---|---|
| Example 1 | 25 | 0.5 | 1.7 |
| Comparative Example 1 | 24 | 2.6 | 6.5 |

The pores formed in the weld bead obtained in Example 1 were much smaller in size than those formed in the weld bead in Comparative Example 1. The spikes formed in the weld bead in Example 1 were extremely short, and therefore, no cold shut occurred. However, in the weld bead obtained in Comparative Example 1, cold shuts also occurred.

A comparison of the weld bead obtained in Example 1 with that obtained in Comparative Example 1 clearly shows that by controlling the current value of electron beam 26 according to the oscillation of the focus of electron beam 26 by the method of this invention, the occurrence of defects in the resulting weld bead can be markedly inhibited without appreciably changing the depth of penetration.

EXAMPLE 2

Two steel sheets (SM50, JIS) were welded by the partial penetration welding procedure in an electron beam welding apparatus of the structure shown in FIG. 6. A direct-current high voltage of 40 KV was supplied from a direct-current high voltage power source 12, and the current value of electron beam 26 was set at 270 mA. The steel sheets were moved at a rate of 76.2 cm/min. during the welding process. The direct-current high voltage supplied from the power source 12 was a pulsating voltage having a ripple content of 3% in peak-to-peak with a ripple frequency of 100 Hz.

When the current flowing through line 40 was lower than the predetermined value, oscillator 64 was excited to produce a signal of 10 KHz by which the electron beam 26 was oscillated with an amplitude of ±1 mm in a direction at right angles to the moving direction of the steel sheets. The time interval for the oscillation of the electron beam 26 was about 70% of the half period of the variation of the current flowing through line 40.

The resulting weld bead had the characteristics shown in Table 2.

COMPARATIVE EXAMPLE 2

Electron beam welding was performed by the partial penetration welding procedure under the same conditions as in Example 2 except that the electron beam 26 was not oscillated when the current flowing through line 40 dropped below the predetermined value. The resulting weld bead had the characteristics shown in Table 2.

COMPARATIVE EXAMPLE 3

Electron beam welding was performed by the partial penetration welding procedure under the same conditions as in Example 2 except that the electron beam 26 was continuously oscillated by continuously exciting oscillator 64 irrespective of the value of the current flowing through line 40. The weld bead obtained had the characteristics shown in Table 2.

TABLE 2

| Run | Penetration depth (mm) | Maximum length of spike (mm) | Number of pores per cm |
|---|---|---|---|
| Example 2 | 25.1 | 1.6 | 0.3 |
| Comparative Example 2 | 25.8 | 1.5 | 2.7 |
| Comparative Example 3 | 22.0 | 1.7 | 0.3 |

It is seen from Table 2 that in the weld bead obtained in Example 2, the occurrence of pores was markedly inhibited without appreciably decreasing the depth of penetration. In the weld bead obtained in Example 1, the length of the spikes was substantially the same as that of the spikes formed in the weld bead of Comparative Example 2. However, as can be easily understood from the extremely small number of pores formed, the sharpness of the spikes was much less than that of the spikes formed in the bead of Comparative Example 2, and therefore, the occurrence of cold shut could be completely avoided.

It is also seen from Table 2 that the number of pores occurred in the weld bead formed in Comparative Example 2 was large, and the spikes were sharp. The occurrence of cold shuts was also observed.

In the weld bead obtained in Comparative Example 3, the number of pores formed was small, and the occurrence of cold shut was not observed. However, as shown in Table 2, the depth of penetration was considerably decreased.

It is evident therefore that the occurrence of defects in a weld bead can be markedly inhibited without appreciably decreasing the depth of penetration by performing electron beam welding in accordance with the partial penetration welding procedure such that the electron beam 26 was oscillated sideways at a high frequency upon the downward movement of the focus of electron beam 26.

EXAMPLE 3

Two steel sheets (SM50, JIS) having a thickness of 30 mm were welded by the full penetration welding procedure in an electron beam welding apparatus of the structure shown in FIG. 6. A direct-current high voltage of 50 KV was supplied from a direct-current high voltage power source 12, and the current value of electron beam 26 was set at 260 mA. The steel sheets were moved at a rate of 76.2 cm/min. during the welding process. The direct-current high voltage supplied from the power source 12 was a pulsating voltage having a ripple content of 3% in peak-to-peak with a ripple frequency of 100 Hz.

When the current flowing through line 40 was lower than the predetermined value, oscillator 64 was excited to produce a signal of 10 KHz by which the electron beam 26 was oscillated with an amplitude of ±1 mm in a direction at right angles of the moving direction of the steel sheets. The time interval for the oscillation of the electron beam 26 was about 70% of the half period of the variation of the current flowing through line 40.

The resulting weld bead had the characteristics shown in Table 3.

COMPARATIVE EXAMPLE 4

Electron beam welding was performed by the full penetration welding procedure under the same conditions as in Example 3 except that the electron beam 26 was not oscillated when the current flowing through line 40 dropped below the predetermined value. The resulting weld bead had the characteristics shown in Table 3.

COMPARATIVE EXAMPLE 5

Electron beam welding was performed by the full penetration welding procedure under the same conditions as in Comparative Example 4 except that the current value of electron beam 26 was increased to 320 mA by decreasing the absolute value of the bias voltage applied to the Wehnelt electrode 6. The resulting weld bead had the characteristics shown in Table 3.

COMPARATIVE EXAMPLE 6

Electron beam welding was performed by the full penetration welding procedure under the same conditions as in Comparative Example 4 except that the current value of electron beam 26 was increased to 400 mA by further decreasing the absolute value of the bias voltage applied to the Wehnelt electrode 6. The resulting weld bead had the characteristics shown in Table 3.

COMPARATIVE EXAMPLE 7

Electron beam welding was performed by the full penetration welding procedure under the same conditions as in Example 3 except that the current value of the electron beam 26 was increased to 320 mA by decreasing the absolute value of the bias voltage applied to the Wehnelt electrode 6, and the electron beam 26 was continuously oscillated by continuously exciting oscillator 64 irrespective of the value of the current flowing through line 40. The resulting weld bead had the characteristics shown in Table 3.

TABLE 3

| Run | Bead width (mm) | | Bead profile |
|---|---|---|---|
| | Surface | Back Surface | |
| Example 3 | 2.0 | 1.5 | Z |
| Comparative Example 4 | 1.5 | 1.7 | X |
| Comparative Example 5 | 1.5 | 1.9 | Y |
| Comparative Example 6 | 1.5 | 2.2 | Z |
| Comparative Example 7 | 2.5 | 1.4 | Z |

Figure 9:
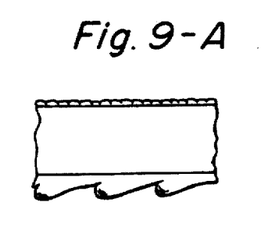
Figure 10:
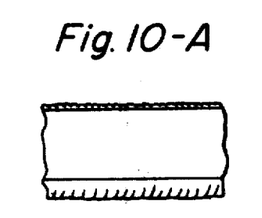
Figure 11:
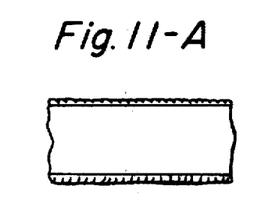

In Table 3, the bead profile X is the profile shown in FIGS. 9-A and 9-B; the bead profile Y, the profile shown in FIGS. 10-A and 10-B; and the bead profile Z, the profile shown in FIGS. 11-A and 11-B.

As is understood from Table 3, in the weld bead obtained in Comparative Example 4, the molten metal periodically became droplets on the back surface of the steel sheets welded, and the bead became serrate at the back of the welded steel sheets (FIGS. 9-A and 9-B).

In the weld bead obtained in Comparative Example 5 in which the current value of the electron beam 26 was increased to 320 mA, the bead did not become serrate, but considerably projected, at the back surface of the welded steel sheets (FIGS. 10-A and 10-B).

In Comparative Example 6, the current value of electron beam 26 was increased to 400 mA, and the central portion of the electron beam 26 which had a high power density completely passed through the steel sheets to be welded. Thus, this central portion was not utilized for the melting of the steel sheets, and the steel sheets were melted by the skirt portion of the electron beam 26 which had a low power density. According to the procedure of Comparative Example 6, a weld bead of good quality could be obtained as shown in FIGS. 11-A and 11-B. However, because of the considerably high current value of the electron beam 26, power consumption was exceedingly high.

In Comparative Example 7 in which the current value of the electron beam 26 was increased to 320 mA and the electron beam 26 was oscillated continuously, power consumption increased corresponding to an increase in the current value of electron beam 26. In addition, as is seen from Table 3, the bead width at the surface of the welded steel sheets somewhat increased.

According to Example 3, a weld bead of good quality (FIGS. 11-A and 11-B) was obtained. The current value of the electron beam 26 was the same as that in Comparative Example 4, and much lower than those in Comparative Examples 5, 6 and 7. Hence, the power consumption could be minimized.

It is evident therefore that a weld bead of good quality can be obtained without exceedingly high power consumption by performing electron beam welding in accordance with the full penetration welding procedure in such a manner that the oscillation of the focus of the electron beam 26 is detected, and upon the downward movement of its focus, the electron beam 26 is oscillated sideways at a high frequency.

What we claim is:

1. In a method for electron beam welding which comprises producing electrons, accelerating the electrons by the application of a high voltage to form an electron beam, converging and focusing the electron beam with a converging lens, and irradiating the converged electron beam onto materials to be welded, thereby forming a molten area on the materials to be welded, the improvement wherein the output of a welding device is detected, from which an oscillation of the focus of said electron beam which is due to a low frequency pulsation in said high voltage is detected, and the electron beam is controlled according to the detected oscillation of said focus for a period of time not more than one half the period of the pulsation.

2. The method of claim 1 wherein the oscillation of the focus of the electron beam is detected by capturing electrons emitted from a superheated molten part of the materials to be welded.

3. The method of claim 1 wherein the oscillation of the focus of the electron beam is detected by detecting the ripple of said high voltage.

4. The method of any one of claims 1 to 3 wherein the control of the electron beam is effected by varying the current value of the electron beam, said variation being accomplished by decreasing the current value of the electron beam upon the approach of the focus of the electron beam toward a penetrating end portion of the molten area of the materials to be welded, and by increasing the current value of the electron beam when the focus of the electron beam is away from the penetrating end portion of the molten area of the materials to be welded.

5. The method of claim 4 wherein the degree of the variation in the current value of the electron beam is not more than 15%.

6. The method of claim 5 wherein the degree of the variation in the current value of the electron beam is not more than 10%.

7. The method of claim 4 wherein the degree of the variation in the current value of the electron beam is not more than 15% of the current value of the electron beam prior of said variation.

8. The method of claim 7 wherein the degree of the variation in the current value of the electron beam is not more than 10% of the current value of the electron beam prior to said variation.

9. The method of any one of claims 1 to 3 wherein the control of the electron beam is effected by oscillating the electron beam sideways at a high frequency to reduce its power density upon the approach of the focus of the electron beam to a penetrating end portion of the molten area of the materials to be welded.

10. The method of claim 9 wherein the electron beam is oscillated at a frequency of at least 500 Hz.

11. The method of claim 10 wherein the electron beam is oscillated at a frequency of at least 1,000 Hz.

12. The method of claim 9 wherein the electron beam is oscillated at a frequency of at least 500 Hz.

13. The method of claim 12 wherein the electron beam is oscillated at a frequency of at least 1,000 Hz.

14. The method of any one of claims 1-3 wherein the control of the electron beam is effected by varying the current value of the electron beam, said variation being accomplished by decreasing the current value of the electron beam upon the approach of the focus of the electron beam toward a penetrating end portion of the molten area of the materials to be welded.

15. The method of claim 14 wherein the degree of the variation in the current value of the electron beam is not more than 15% of the current value of the electron beam prior to said variation.

16. The method of any one of claims 1-3 wherein the control of the electron beam is effected by varying the current value of the electron beam, said variation being accomplished by increasing the current value of the electron beam when the focus of the electron beam is away from the penetrating end portion of the molten area of the materials to be welded.

17. The method of claim 16 wherein the current value of the electron beam is varied for a duration corresponding to not more than $\frac{1}{2}$ the period of said pulsation.

18. The method of claim 16 wherein the degree of the variation in the current value of the electron beam is not more than 15% of the current value of the electron beam prior to said variation.

19. In an electron beam welding apparatus comprising an electron gun having a filament, a heating power source for supplying an electric current to the filament to heat it and release electrons from the filament and a high voltage power source for accelerating the electrons by the application of a high voltage to form an electron beam; and a converging lens for converging and focusing the electron beam from the electron gun and irradiating the electron beam onto materials to be welded; the improvement wherein said apparatus further comprises a detecting means for detecting the output of a welding device from which an oscillation of the focus of the electron beam which is due to a low frequency pulsation in said high voltage, and a control means for controlling the electron beam according to the detected oscillation of said focus for a period of time not more than one half the period of the pulsation.

20. The apparatus of claim 19 wherein said detecting means includes a detecting electrode for capturing electrons emitted from the materials to be welded, and produces a signal according to the amount of the electrons captured.

21. The apparatus of claim 20 wherein said controlling means receives the signal produced by said detecting means, and varies the current value of the electron beam by decreasing the current value of the electron beam when the amount of the electrons captured by the detecting electrode decreases, and increasing the current value of the electron beam when the amount of the electrons captured by the detecting electrode increases.

22. The apparatus of claim 20 wherein the controlling means receives the signal produced by said detecting means and varies the current value of the electron beam by decreasing the current value of the electron beam when the amount of electrons captured by the detecting electrode decreases.

23. The apparatus of claim 20 wherein said controlling means receives the signal produced by said detecting means, and varies the current value of the electron beam by increasing the current value of the electron beam when the amount of electrons captured by the detecting electrode increases.

24. The apparatus of claims 21, 22 or 23 wherein said control means varies the current value of the electron beam by not more than 15% by varying the bias voltage to be applied to a Wehnelt electrode disposed near said filament.

25. The apparatus of claim 24 wherein said control means varies the current value of the electron beam by not more than 10%.

26. The apparatus of claim 20 wherein said control means receives the signal produced by said detecting means, and when the amount of the captured electrons at the detecting electrode decreases, oscillates the electron beam sideways at a high frequency to reduce the power density of the electron beam.

27. The apparatus of claim 26 wherein said control means oscillates the electron beam by applying a deflected alternating-current voltage with a frequency of at least 500 Hz to a deflecting coil provided adjacent said converging lens.

28. The apparatus of claim 27 wherein said deflected alternating-current voltage has a frequency of at least 1,000 Hz.

29. The apparatus of claim 19 wherein said detecting means is connected to said high voltage power source, and detects a periodic ripple in said high voltage for accelerating the electrons and produces a signal according to the detected ripple.

30. The apparatus of claim 29 wherein said control means receives the signal produced by said detecting means, and varies the current value of the electron beam when the absolute value at the high voltage varies by decreasing the current value of the electron beam when the absolute value of said high voltage increases, and increasing the current value of the electron beam when the absolute value of the high voltage decreases.

31. The apparatus of claim 29 wherein said control means receives the signal produced by said detecting means and varies the current value of the electron beam when the absolute value of the high voltage varies by increasing the current value of the electron beam when the absolute value of the high voltage decreases.

32. The apparatus of claim 29 wherein said control means receives the signal produced by said detecting means, and varies the current value of the electron beam when the absolute value of the high voltage varies by decreasing the current value of the electron beam when the absolute value of the high voltage increases.

33. The apparatus of claims 30, 31 or 32 wherein said control means varies the current value of the electron beam by not more than 15% by varying the bias voltage to be applied to a Wehnelt electrode provided near said filament.

34. The apparatus of claim 33 wherein said control means varies the current value of the electron beam by not more than 10%.

35. The apparatus of claim 29 wherein said control means receives the signal produced by said detecting means, and when the absolute value of said high voltage increases, oscillates said electron beam sideways to decreases the power density of the electron beam.

36. The apparatus of claim 35 wherein said control means oscillates said electron beam by applying a deflected alternating-current voltage having a frequency of at least 500 Hz to a deflecting coil disposed adjacent said converging lens.

37. The apparatus of claim 36 wherein said deflected alternating-current voltage has a frequency of at least 1,000 Hz.

* * * * *